United States Patent [19]
Nakajima et al.

[11] Patent Number: 5,986,306
[45] Date of Patent: Nov. 16, 1999

[54] THIN FILM TRANSISTOR HAVING A HEAT SINK THAT EXHIBITS A HIGH DEGREE OF HEAT DISSIPATION EFFECT

[75] Inventors: Setsuo Nakajima; Takeshi Fukunaga, both of Kanagawa, Japan

[73] Assignee: Semiconductor Energy Laboratory Co., Ltd., Japan

[21] Appl. No.: 09/205,019

[22] Filed: Dec. 4, 1998

[30] Foreign Application Priority Data

Dec. 8, 1997 [JP] Japan ................................ 9-356237

[51] Int. Cl.⁶ ............................ H01L 27/01; H01L 27/12; H01L 31/0392
[52] U.S. Cl. .............................. 257/353; 257/66; 257/352
[58] Field of Search ............................ 257/57, 59, 66, 257/72, 347, 352, 353

[56] References Cited

U.S. PATENT DOCUMENTS

| | | | |
|---|---|---|---|
| 5,397,904 | 3/1995 | Arney et al. | 257/66 |
| 5,874,746 | 2/1999 | Holmberg et al. | 257/59 |
| 5,895,935 | 4/1999 | Yamazaki et al. | 257/59 |

*Primary Examiner*—Ngân V. Ngô
*Attorney, Agent, or Firm*—Cook, Alex, McFarron, Manzo, Cummings & Mehler, Ltd.

[57] ABSTRACT

In forming a pair of impurity regions in an active layer, an intrinsic or substantially intrinsic region having a double-sided comb shape is also formed by using a proper mask. The intrinsic or substantially intrinsic region is composed of a portion that effectively functions as a channel forming region and portions in which a channel is not formed and which function as heat sinks. The heat dissipation effect is improved because the heat sinks are formed by the same material as the channel forming region.

19 Claims, 7 Drawing Sheets

THIN FILM TRANSISTOR HAVING A HEAT SINK THAT EXHIBITS A HIGH DEGREE OF HEAT DISSIPATION EFFECT

BACKGROUND OF THE INVENTION

1. Field of the Invention

The present invention relates to thin-film elements using a thin-film semiconductor, particularly a thin-film transistor (hereinafter abbreviated as TFT). The invention also relates to semiconductor devices such as electro-optical devices and semiconductor circuits using such a thin-film transistor.

2. Description of the Related Art

In recent years, with the spread of liquid crystal displays (LCDs), active matrix liquid crystal displays (AMLCD) are required to be improved in performance. However, there have been pointed out various problems that obstruct the improvement in performance.

Increase in operation speed is one item of the required improvements in performance. However, it is known that the self-heating of a TFT increases as the operation speed is increased. This is also problematic in ICs.

In particular, in circuits, such as driver circuits (a buffer, an analog switch, etc.), in which large current needs to flow and which are hence constituted of TFTs having a very long channel width (W), each constituent TFT exhibits a high degree of self-heating and the temperature of the entire circuit may become abnormally high. There is a report that the temperature increased to as high as several hundred degrees centigrade in certain situations.

The self-heating varies or deteriorates the characteristics of a TFT and makes it difficult to realize highly reliable products. To suppress self-heating of a TFT having a long channel width, the following conventional technique has been proposed.

FIG. 2A is a schematic top view showing an active layer (thin-film semiconductor layer) of a TFT. FIGS. 2B–2D are sectional views taken along lines A–A', B–B', and C–C' in FIG. 2A, respectively.

In FIG. 2A, reference numeral 201 denotes a substrate having an insulative surface, and 202 and 203 denote a pair of impurity regions formed by adding an n-type or p-type impurity to an active layer that is a semiconductor thin film. The impurity regions 202 and 203 serve as source/drain regions.

The pair of impurity regions 202 and 203 are formed in a self-aligned manner by using a gate electrode 204 as a mask. The region under the gate electrode 204 is doped with neither of those impurities and channel forming regions 205 are formed there (see FIGS. 2B and 2D).

The conventional structure shown in FIGS. 2A–2D has a feature that openings 206 are formed in the active layer in patterning it and the channel forming region is divided into a plurality of parts. That is, substantially a plurality of TFTs are arranged in parallel.

The openings 206 function as heat sinks for allowing escape of Joule heat generated in the channel forming regions 205. That is, this technique allows Joule heat generated in the channel forming regions 205 to escape efficiently, thereby reducing the amount of heat generated in the TFT and in turn securing its reliability.

In the conventional technique shown in FIGS. 2A–2D, the regions 206 serving as the heat sinks are filled with a gate insulating film 207. Therefore, the channel forming regions 205 are insulated from each other by the gate insulating film 207.

Therefore, Joule heat generated in the channel forming regions 205 is introduced to the gate insulating film (typically a silicon oxide film) 207. However, the efficiency of heat dissipation is not high because the heat conductivity of silicon oxide (about 1.4 W/mK) is two orders smaller than that of silicon (about 150 W/mK). This results in a problem that a sufficient level of heat dissipation effect cannot be obtained.

SUMMARY OF THE INVENTION

An object of the present invention is to provide a TFT having a heat sink that exhibits a higher degree of heat dissipation effect than in the conventional technique, thereby realizing a highly reliable semiconductor device.

The invention provides a semiconductor device comprising a semiconductor circuit having a plurality of thin-film transistors that use a thin-film semiconductor as an active layer, wherein the active layer comprises a pair of impurity regions exhibiting an n-type or p-type conductivity and an intrinsic or substantially intrinsic region interposed between the pair of impurity regions; and wherein the intrinsic or substantially intrinsic region comprises a first region and second regions projecting from the first region, only the first region being overlapped with a gate electrode.

One important feature of the invention is that in the above configuration the first region has been formed in a self-aligned manner by using the gate electrode as a mask and the second regions have been formed intentionally by photolithography.

According to another aspect of the invention, there is provided a semiconductor device comprising a semiconductor circuit having a plurality of thin-film transistors that use a thin-film semiconductor as an active layer, wherein the active layer comprises a pair of impurity regions exhibiting an n-type or p-type conductivity and an intrinsic or substantially intrinsic region interposed between the pair of impurity regions; and wherein the intrinsic or substantially intrinsic region assumes a double-sided comb shape that comprises a trunk portion extending approximately perpendicularly to a channel direction and branch portions extending approximately parallel with the channel direction, only the trunk portion being overlapped with a gate electrode.

In each of the above configurations, the thin-film semiconductor can be a silicon semiconductor or a compound semiconductor including silicon.

According to another aspect of the invention, there is provided a manufacturing method of a semiconductor, comprising the steps of forming an active layer by patterning a thin-film semiconductor; forming a gate electrode above the active layer via an insulating film; forming one or a plurality of island-like mask patterns so that they cross the gate electrode and extend perpendicularly to a longitudinal direction of the gate electrode; and adding an n-type or p-type impurity to the active layer by using the gate electrode and the one or plurality of mask patterns as masks.

According to still a further aspect of the invention, there is provided a manufacturing method of a semiconductor, comprising the steps of forming a gate electrode; forming an active layer made of a thin-film semiconductor above the gate electrode via an insulating film; forming an insulating film pattern having a double-sided comb shape above the active layer; and adding an n-type or p-type impurity to the active layer by using the insulating film pattern as a mask.

In each of the above manufacturing methods, each of a pair of impurity regions formed by the impurity adding step assumes a comb-teeth shape and the teeth portions of the pair of impurity regions are opposed to each other. That is, an intrinsic or substantially intrinsic region having a double-sided comb shape is formed under the insulating film pattern as the mask in the impurity adding step.

DETAILED DESCRIPTION OF THE PREFERRED EMBODIMENTS

The present invention as summarized above will be hereinafter described in detail by using embodiments.

Figure 1A:
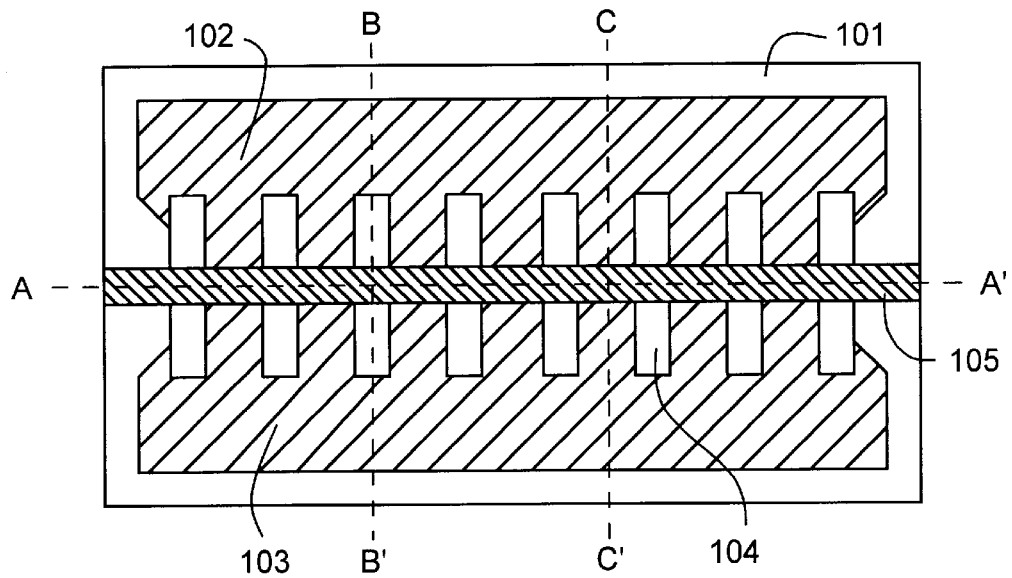
FIGS. 1A–1D show the structure of an active layer according to the invention.
Figure 1B:
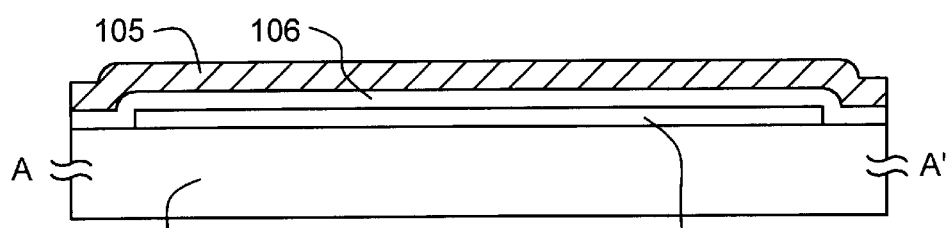
Figure 1C:
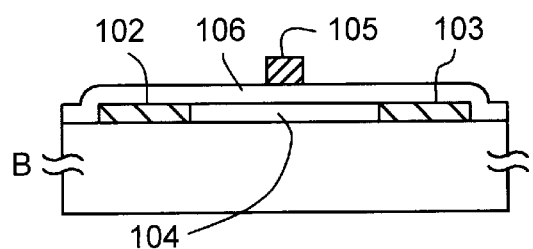
Figure 1D:
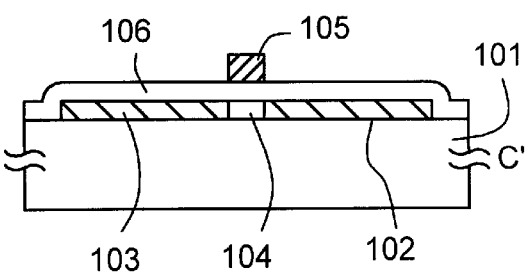
Figure 2A:
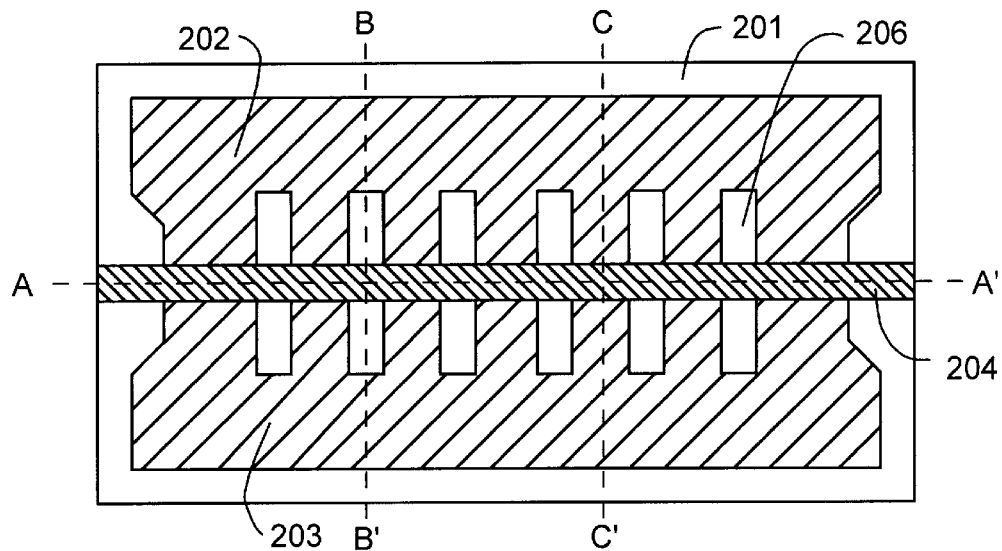
FIGS. 2A–2D show the structure of a conventional active layer.
Figure 2B:
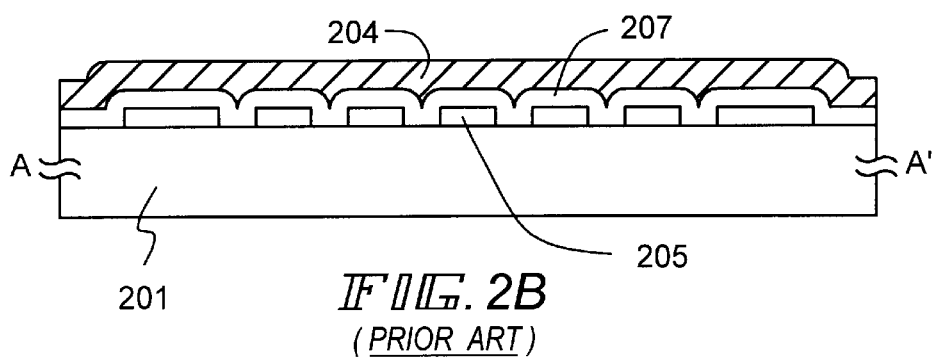
Figure 2C:
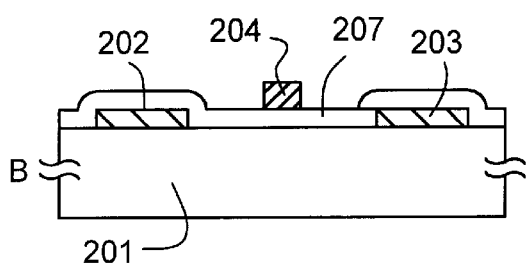
Figure 2D:
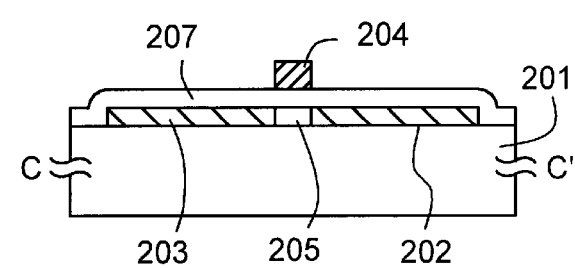

First, a general concept of the invention will be described with reference to FIGS. 1A–1D. FIG. 1A is a top view of an active layer that utilizes the invention. FIGS. 1B–1D are sectional views taken along lines A–A', B–B', and C–C' in FIG. 1A, respectively.

In FIG. 1A, reference numeral 101 denotes a substrate having an insulative surface, and 102 and 103 denote a pair of impurity regions (source/drain regions) formed by adding an n-type or p-type impurity to an active layer that is a semiconductor thin film.

An intrinsic or substantially intrinsic semiconductor region 104 is formed so as to be interposed between the impurity regions 102 and 103. The term "intrinsic semiconductor region" means a completely neutral semiconductor region where no impurity for imparting one type of conductivity is added. The term "substantially intrinsic semiconductor region" means a region that exhibits n-type or p-type conductivity in such a range that the threshold voltage is controllable (i.e., the concentration of an n-type or p-type impurity is $1\times10^{17}$ atoms/cm$^3$ or less, preferably $1\times10^{16}$ atoms/cm$^3$ or less), or a region where a conductivity type is canceled out intentionally.

Figure 3:
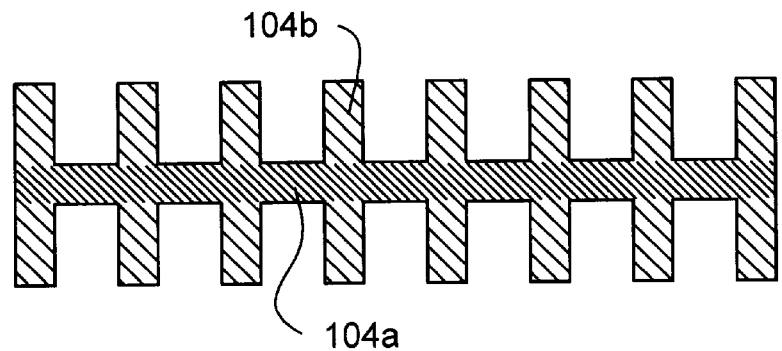
FIG. 3 shows the structure of an intrinsic or substantially intrinsic region shown in FIGS. 1A–1D.

FIG. 3 shows only the intrinsic or substantially intrinsic region 104. As shown in FIG. 3, the region 104 comprises a double-sided comb shape consisting of a trunk portion (hereinafter referred to as a first region) 104a extending approximately perpendicularly to the channel direction and branch portions (hereinafter referred to as second regions) 104b extending approximately parallel with the channel direction. As a result, each of the impurity region 102 and 103 assumes a comb-teeth shape.

The first region 104a, which exists right under the gate electrode 105 via a gate insulating film 106 in FIG. 1A, is formed in a self-aligned manner in forming the source/drain regions 102 and 103 by using the gate electrode 105 as a mask.

On the other hand, the second regions 104b, which projects from the first region 104a (preferably approximately perpendicularly thereto), are formed intentionally by photolithography.

As apparent from FIG. 1A, since only the first region 104a coextends with the gate electrode 105, a channel region that is formed during operation of the TFT is formed only in the first region 104a. In this sense, the first region 104a can also be called a channel forming region.

On the other hand, the second regions 104b are semiconductor regions that are always kept intrinsic or substantially intrinsic because it does not overlap with the gate electrode 105. Since only this portion has high resistivity, it does not serve as a source or drain region and a channel is not formed there.

However, in the invention, the second regions 104b has a role of heat sinks for allowing escape of Joule heat generated in the channel forming region and a role of substantially dividing the channel forming region into a plurality of parts.

That is, by forming the second regions 104b, the channel forming region is divided into a plurality of parts and Joule heat generated in each channel forming region can be introduced to the second regions 104b (resultantly to the gate electrode 105 or the source/drain regions 102 and 103). As a result, accumulation of Joule heat in the active layer (particularly in its central portion) can be prevented effectively.

In the conventional technique described in the background section, heat dissipation is effected by the openings that are formed in the active layer. However, this structure cannot provide an efficient heat dissipation effect because of too large a difference in heat conductivity. In contrast, in the structure of the invention, the difference in heat conductivity is negligible because the heat sinks are made of the same semiconductor layer as the channel forming region; heat dissipation is effected very efficiently.

Figure 4:
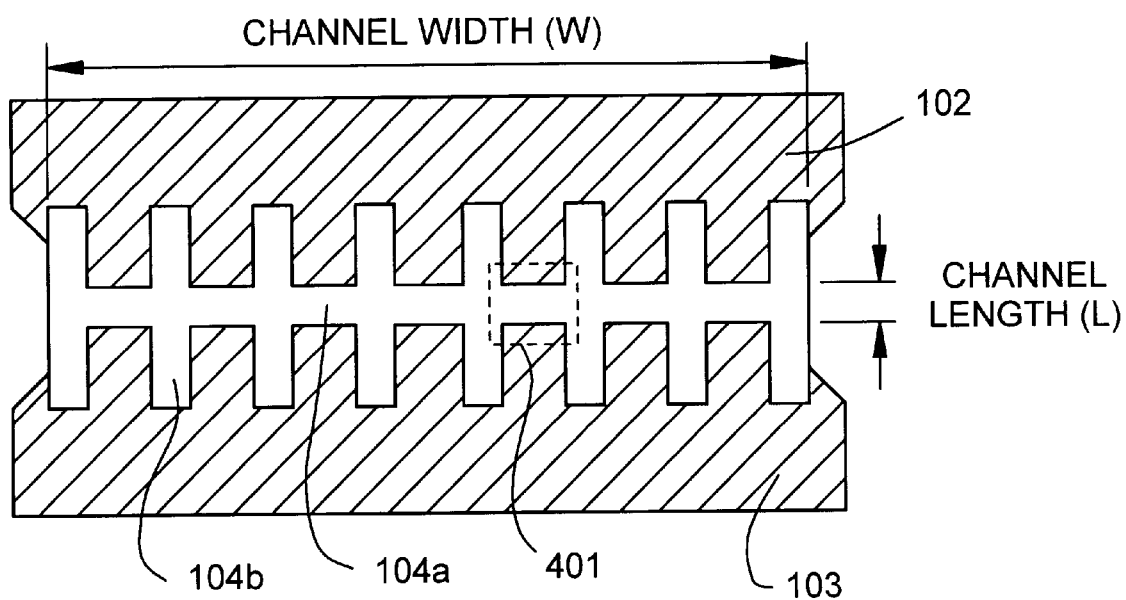
FIG. 4 illustrates definitions of a channel length and a channel width.

Now, a channel length and a channel width will be defined with reference to FIG. 4. FIG. 4 shows only the active layer of FIG. 1A.

In this specification, in FIG. 4, the shortest distance (corresponds to the gate electrode width) connecting the impurity regions 102 and 103 is defined as a channel length L (the direction along the channel length L is called a channel direction). A width of the channel forming region in the direction perpendicular to the channel direction is defined as a channel width W.

A channel is formed in the entire region right under the gate electrode 105, and hence the channel forming region is the first region (trunk portion) 104a. Therefore, based on the above definitions, it can be said that the channel forming region (considered a carrier movement path, has the channel length L and the channel width W.

However, actually it is considered that carriers move with priority in regions where the impurity regions 102 and 103 are closest to each other, effective channel regions are regions 401 (one of which is enclosed by a broken line). That is, it can be said that the portions of the channel forming region that are interposed between the branch portions 104b serving as the heat sinks have almost no contribution to carrier movement and mainly function as parts of the heat sinks.

Therefore, although the entire channel forming region has the channel width W, an effective channel width (actually contributory to carrier movement) is given by the sum of channel widths of the effective channel regions 401.

As described above, the TFT utilizing the invention has the features that the active layer has the intrinsic or substantially intrinsic region that assumes a double-sided comb shape, and that part of that region is used as the channel forming region that contributes to carrier movement while the other portions are used as heat sinks for dissipating Joule heat.

The most important point is that the regions used as the heat sinks are formed by the same semiconductor layer as the channel forming region, whereby there exists no difference in heat conductivity and hence the heat dissipation effect is improved.

Specific embodiments of the invention will be hereinafter described.

Embodiment 1

A manufacturing process of a TFT utilizing the invention will be described below with reference to FIGS. 5A–5E and 5A'–5E', which are sectional views taken along lines B–B' and C–C' in FIG. 1A, respectively.

Figure 5A:
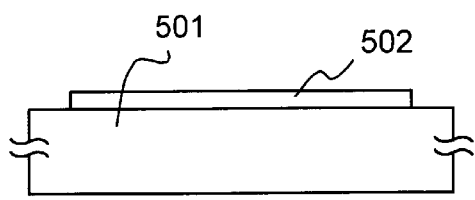
FIGS. 5A–5E and 5A'–5E' are sectional views showing a manufacturing process of a TFT according to a first embodiment of the invention.
Figure 5A:
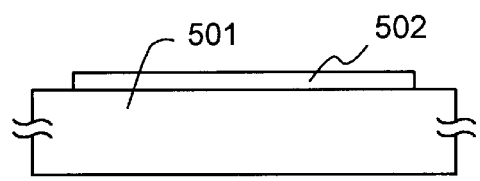

In FIGS. 5A and 5A', reference numeral 501 denotes a substrate having an insulative surface which may be a glass substrate, a silicon substrate, a glass ceramics substrate, or the like, formed with an undercoat film thereon. In the case of a quartz substrate, there is no specific reason for forming an undercoat film.

Then, a crystalline silicon film as an active layer 502 is formed on the substrate 501. The crystalline silicon film may be either a single crystal thin film or a polycrystalline thin film. Where a single crystal thin film is formed, an SOI substrate such as an SIMOX or UNIBOND substrate may be used.

Where a polycrystalline thin film is formed, it may be one formed by any known process. Usually, an amorphous silicon film is crystallized by laser processing or furnace annealing. Instead of a silicon film, compound semiconductors including silicon such as $Si_xGe_{1-x}(0<X<1)$ may be formed.

Figure 5B:
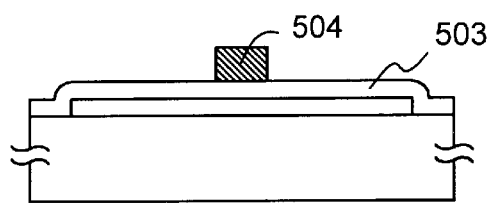
Figure 5B:
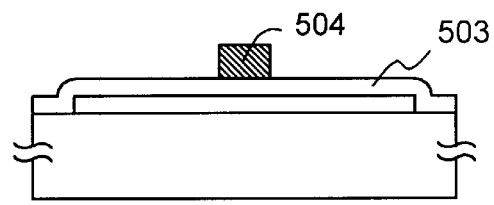

Then, a 120-nm-thick gate insulating film 503 is formed so as to cover the active layer 502, and a metal film or a conductive silicon film as a gate electrode 504 is formed thereon (see FIGS. 5B and 5B').

Then, one or a plurality of resist masks 505 are formed so as to cross the gate electrode 504 and extend perpendicularly to the longitudinal direction of the gate electrode 504 (i.e., approximately parallel with the channel direction). The resist masks 505 are patterned in island-like form.

In this state, a pair of impurity regions 506 and 507 are formed by adding an n-type or p-type impurity to the active layer 502 by using the gate electrode 504 and the resist masks 505 as masks. Phosphorus or arsenic may be added to impart n-type conductivity and boron may be added to impart p-type conductivity.

Figure 5C:
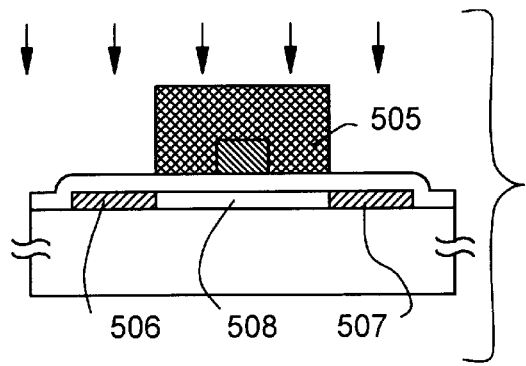
Figure 5C:
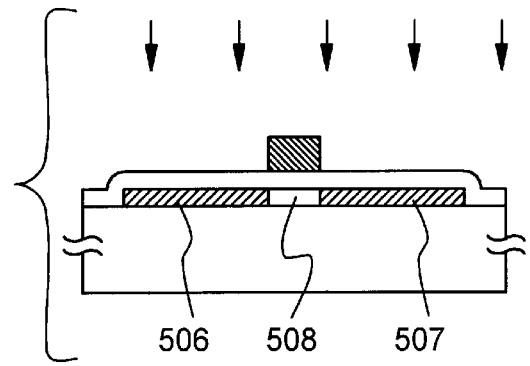

In this step, as shown in FIG. 5C, intrinsic or substantially intrinsic regions 508 wider than the gate electrode 504 are formed in the regions where the resist masks 505 have been intentionally formed. On the other hand, as shown in FIG. 5C', in the region where the resist masks 505 have not been formed, an intrinsic or substantially intrinsic region 508 is formed in a self-aligned manner with only the gate electrode 504 serving as a mask.

In the intrinsic or substantially intrinsic regions 508 shown in FIG. 5C, the regions right under the gate electrode 504 belong to a first region (trunk portion) and the other regions are second regions (branch portions). Substantially all of the regions 508 appearing in FIG. 5C function as heat sinks.

The intrinsic or substantially intrinsic regions 508 shown in FIG. 5C' also belongs to the first region, and all of those regions function as effective channel regions.

Figure 5D:
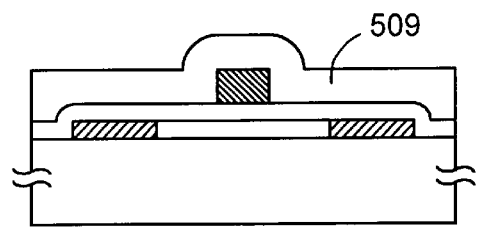
Figure 5D:
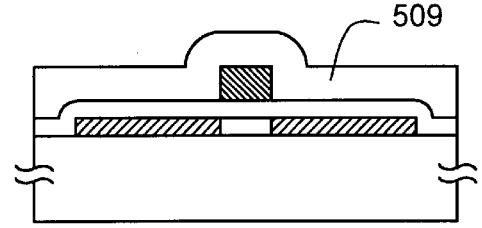
Figure 5E:
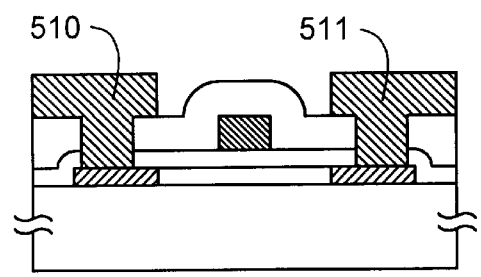
Figure 5E:
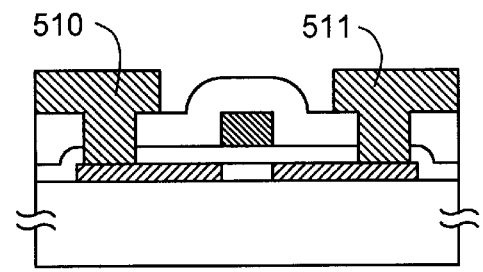

After the pair of impurity regions (source/drain regions) 506 and 507 and the intrinsic or substantially intrinsic semiconductor regions 508 having a double-sided comb shape, the impurity is activated and an interlayer insulating film 509 is formed (see FIGS. 5D and 5D').

Then, after contact holes are formed, source/drain electrodes 510 and 511 are formed. Finally, hydrogenation is performed, to complete a TFT having a structure shown in FIGS. 5E and 5E'.

The most important point of this embodiment is to use the active layer having the structure described above in connection with FIGS. 1A–1D. The other structures are not limited to this embodiment at all.

Therefore, as long as the structure of the active layer of the invention is implemented, TFTs having other structures or TFTs manufactured by other manufacturing methods can well utilize the invention.

For example, a configuration in which low-concentration impurity regions (LDD regions) or offset regions are formed between the channel forming region and the source/drain regions can utilize the invention because the basic structure remains the same.

Embodiment 2

Although the first embodiment is directed to an n-type TFT (NTFT) or a p-type TFT (PTFT), it is effective to construct a CMOS circuit by combining those TFTs complementarily. In particular, in active matrix type LCDs, it is desirable that driver circuits and other signal processing circuits be constituted of CMOS circuits.

Since the advantage of the invention can be obtained in the same manner in both of an n-type and p-type TFTs, a highly reliable semiconductor circuit can be realized by applying the invention to a semiconductor circuit constituted of CMOS circuits.

Further, since the invention can be utilized in a flexible manner, for example, so as to be applied to only NTFTs or PTFTs, TFTs so formed can be combined freely in accordance with the purpose of a circuit.

In active matrix type LCDs, a plurality of circuits are formed on the same substrate and all circuits do not necessarily have the Joule heat problem. Actually, only circuits in which large current needs to flow (a buffer circuit, an analog switch circuit, a level shifter circuit, etc.) are much influenced by Joule heat.

Therefore, the invention may be applied to only circuits in which large current needs to flow (i.e., Joule heat generation is prone to occur).

Embodiment 3

Although the first and second embodiments are directed to the case where the invention is applied to the top-gate TFT (typically a planar TFT), the invention can also be applied to a bottom-gate TFT (typically an inverted staggered structure TFT).

Figure 6A:
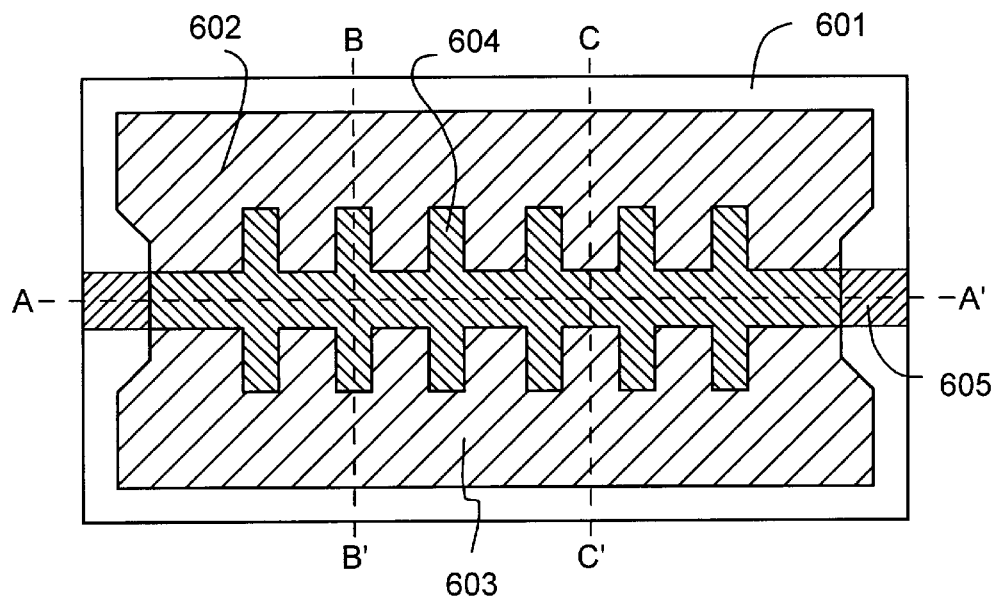
FIGS. 6A–6D show the structure of an active layer according to a third embodiment of the invention.
Figure 6B:
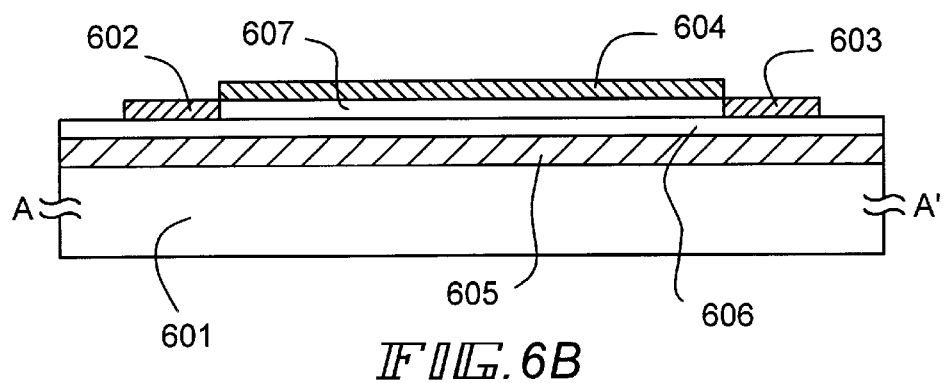
Figures 6C, 6D:
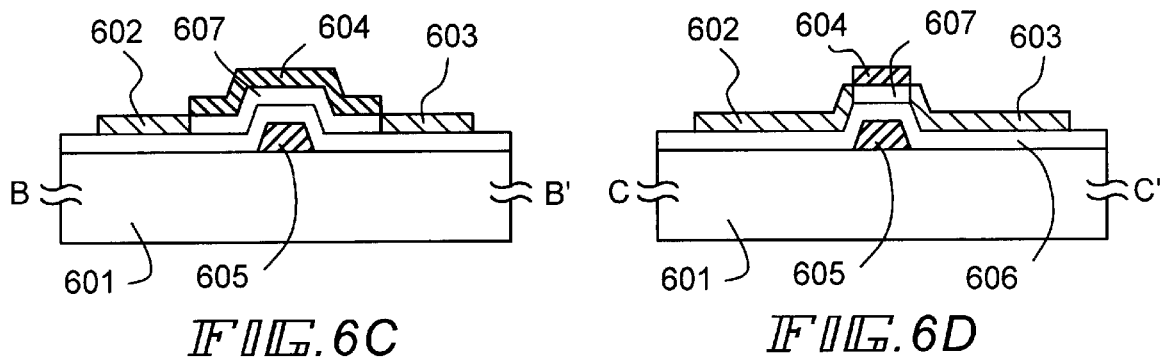

A case where the invention is applied to an inverted staggered structure TFT will be described below with reference to FIGS. 6A–6D. FIG. 6A is a top view of an active layer utilizing the invention, and FIGS. 6B–6D are sectional views taken along line A–A', B–B', and C–C' in FIG. 6A.

In FIG. 6A, reference numeral 601 denotes a substrate having an insulative surface and numerals 602 and 603 denote a pair of impurity regions (source/drain regions) formed by adding an n-type or p-type impurity to a semiconductor thin-film as an active layer. Reference numeral 604 denotes an insulating film pattern as a mask that has been used in forming the impurity regions 602 and 603.

Because of an inverted staggered structure TFT, a gate electrode 605 and a gate insulating film 606 are laminated on the substrate 601 and the active layer (thin-film semiconductor) is formed thereon. Therefore, to implement the invention, an insulating film (silicon oxide film or silicon nitride film) is patterned into the insulating film pattern 604 having a double-sided comb shape and an n-type or p-type impurity is added by using the insulating film pattern 604 as a mask.

As a result of the impurity addition using the insulating film pattern 604 as a mask having a double-sided comb shape, an intrinsic or substantially intrinsic region 607 also having a double-sided comb shape is formed thereunder. As in the above embodiments, the region 607 is such that a channel is formed in a trunk portion and the other portions (branch portions) function as heat sinks. Other detailed descriptions are omitted here because they have already been made in the first embodiment.

As described in this embodiment, the invention can easily be applied to an inverted staggered structure TFT by using an insulating film pattern having a double-sided comb shape. Although in this embodiment effective channel regions cannot be formed in a self-aligned manner, they can be formed in a self-aligned manner by combining this embodiment with a back exposure technique.

Next, a manufacturing process of an inverted staggered structure TFT utilizing the invention will be described with reference to FIGS. 7A–7E and 7A'–7E', which are sectional views taken along lines B–B' and C–C' in FIG. 6A, respectively.

First, a glass substrate 701 formed with a silicon oxide film as an undercoat film is prepared as a substrate having an insulating surface, and a tantalum film as a gate electrode 702 is formed thereon. A gate insulating film 703 that is a laminated film of a silicon nitride film and a silicon oxide film on the glass substrate 701 and the gate electrode 702 (see FIGS. 7A and 7A').

Figure 7A:
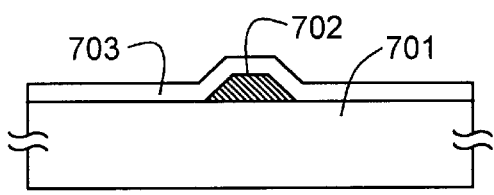
FIGS. 7A–7E and 7A'–7E' are sectional views showing a manufacturing process of a TFT according to the third embodiment of the invention.
Figure 7A:
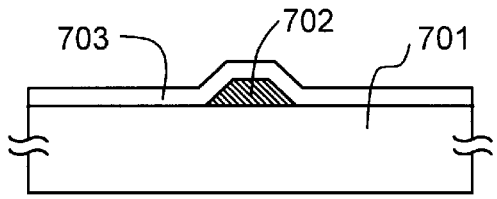
Figure 7B:
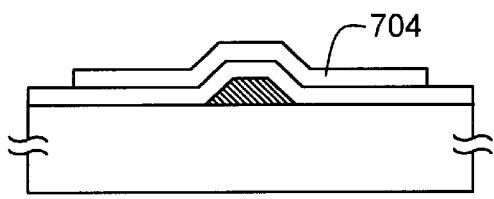
Figure 7B:
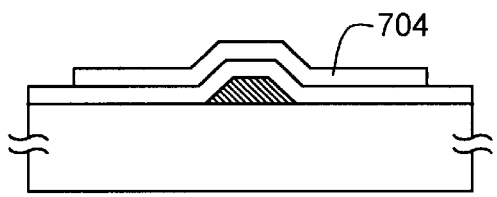
Figure 7C:
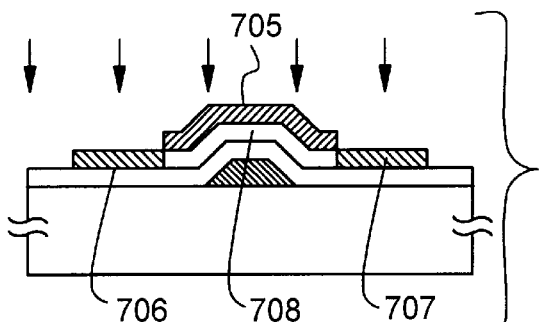
Figure 7C:
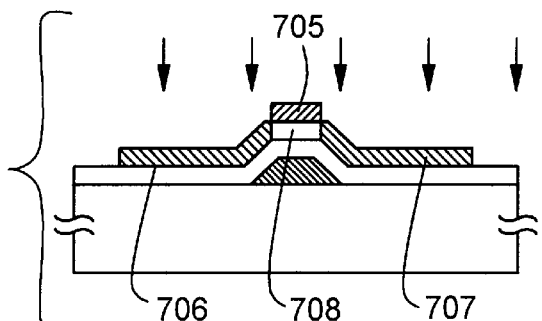

Then, an active layer 704 is formed by forming a polysilicon film by laser-crystallizing an amorphous silicon film (or a $Si_XGe_{1-X}$ film) as shown in FIGS. 7B and 7B'.

Then, an insulating film pattern 705 having a double-sided comb shape (like the shape shown in FIG. 6A) of a silicon oxide film is formed. The insulating film pattern 705 needs to be so thick as to be able to well function as a mask in impurity addition; preferably, the thickness should be 100–200 nm.

After the formation of the insulating film pattern 705, a pair of impurity regions 706 and 707 are formed by adding an n-type or p-type impurity. At the same time, an intrinsic or substantially intrinsic semiconductor region 708 is formed so as to assume a double-sided comb shape (see FIGS. 7C and 7C').

Figure 7D:
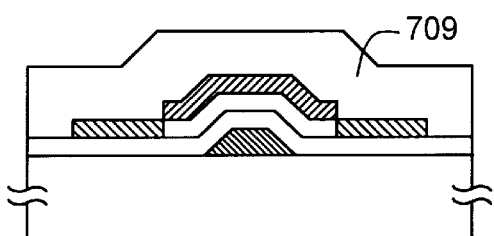
Figure 7D:
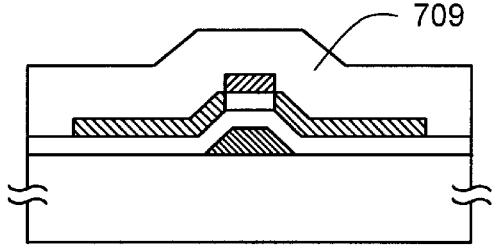
Figure 7E:
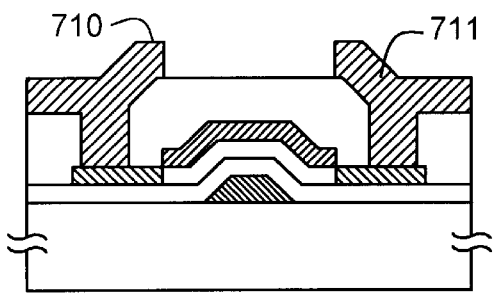
Figure 7E:
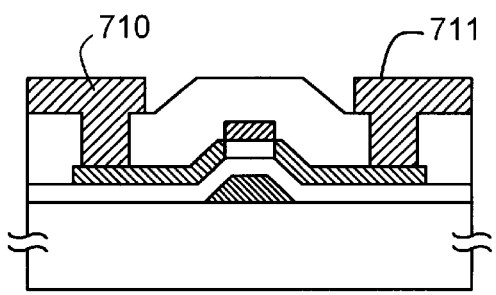

After the formation of the impurity regions (source/drain regions) 706 and 707 and the intrinsic or substantially intrinsic semiconductor region 708 having a double-sided comb shape, the impurity is activated and an interlayer insulating film 709 is formed (see FIGS. 7D and 7D').

The insulating film pattern 705 that was formed in the impurity addition step has a role of protecting the intrinsic or substantially intrinsic region 708. In particular, where an organic resin film is used as the interlayer insulating film 709, the use of the insulating film pattern 705 is effective in preventing contamination from an organic substance.

Then, after contact holes are formed, source/drain electrodes 710 and 711 are formed. Finally, hydrogenation is performed, to complete a TFT having a structure shown in FIGS. 7E and 7E'.

Similar to the first embodiment, the TFT structures are not limited to this embodiment at all. Therefore, bottom-gate type TFTs having other structures or manufactured by other manufacturing methods can well utilize the invention. Naturally, a configuration in which LDD regions or offset regions are formed can utilize the invention.

It goes without saying that inverted staggered structure TFTs of the invention can be utilized to construct a CMOS circuit or can be applied to only part of a circuit, as indicated in Embodiment 2.

Embodiment 4

While in the first and third embodiments it is necessary to intentionally form a mask pattern of a resist mask or the like in forming the branch portions (second regions) of the intrinsic or substantially intrinsic semiconductor region, it is possible to form an intrinsic or substantially intrinsic region having a double-sided comb shape in a self-aligned manner by forming a gate electrode itself in such form.

That is, by patterning a gate electrode into a double-sided comb shape, source/drain regions and an intrinsic or substantially intrinsic region are formed completely in a self-aligned manner.

In the case of a bottom-gate type TFT as described in the third embodiment, a resist pattern having the same shape as the gate electrode can be formed by using back exposure. Impurity addition can be performed in a self-aligned manner by using the resist pattern thus formed.

In this embodiment, a channel is formed in the entire intrinsic or substantially intrinsic semiconductor region when the TFT operates (i.e., when it is in an on-state). However, since the resistivity of the channel forming region is one order or more higher than that of the source/drain regions, carriers move with priority in the regions where the source/drain regions are closest to each other.

Therefore, as a result, this embodiment can provide the advantage of the invention described in the first embodiment. Naturally, from the viewpoint of reducing the amount of generated heat, it is better to cause the second regions to act as complete resistors by not applying a gate voltage to those regions at all as in the case of the first embodiment.

On the other hand, this embodiment provides a merit that the number of patterning steps can be made smaller than in the first embodiment, because the impurity addition step is a completely self-aligned process using only the gate electrode as a mask.

Embodiment 5

Although in the first to fourth embodiments the branch portions (second regions) are provided on both sides, that is, on the sides of both impurity regions (both of the source/drain regions), branch portions may be provided on only one side.

In particular, since heat generation is most prone to occur at the drain junction portion (i.e., the junction portion between the channel forming region and the drain region), a configuration is possible in which second regions are provided only on the drain region side and are not provided on the source region side.

Further, it is not necessary that all the second regions have the same width and length, and the second regions may have different widths or lengths if necessary. For example, second regions in the vicinity of a central portion of the active layer where Joule heat tends to be accumulated may be made wider than those in end portions of the active layer.

Embodiment 6

In this embodiment, arrangements of contact holes for forming source/drain electrodes will be described with reference to FIGS. 8A and 8B.

Figure 8A:
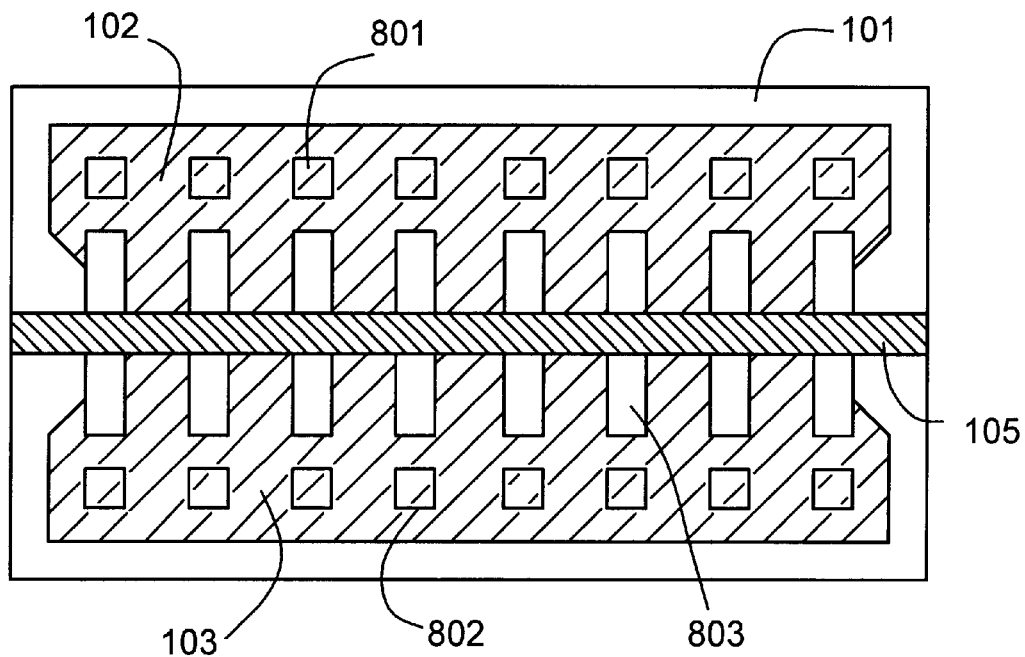
FIGS. 8A and 8B show arrangements of contact holes according to a sixth embodiment of the invention.

FIG. 8A shows an example arrangement of contact holes in a TFT having the structure of FIGS. 1A–1D. The parts in FIG. 8A that are the same as in FIGS. 1A–1D are given the same reference numerals as in FIGS. 1A–1D. In this example, the impurity region 102 is continuous, that is, a side end portion of the active layer serves as a connecting portion. Contact holes 801 are formed in that portion. Similarly, the impurity region 103 is continuous, that is, a side end portion of the active layer serves as a connecting portion. Contact holes 802 are formed in that portion.

Figure 8B:
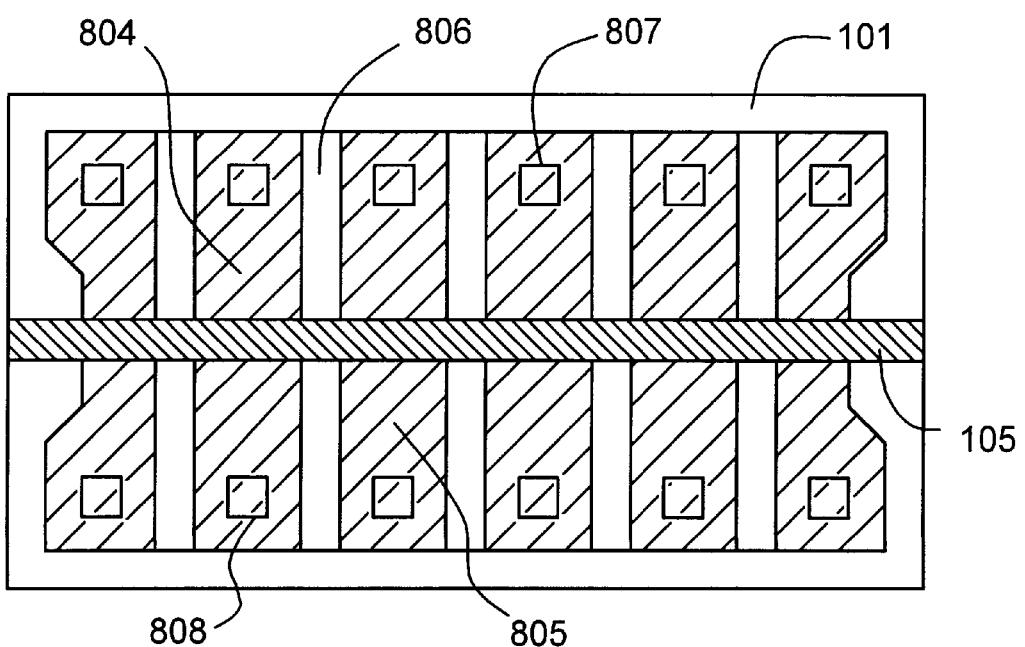

This structure is effective in a case where the intervals between second regions 803 are small. Where the intervals are as small as 3 μm or less, margins large enough to accommodate a contact hole do not exist between the second regions 803. Therefore, it is necessary to secure other spaces for contact holes.

Where the intervals between the second regions are as large as 3 μm or more (preferably 5 μm or more), contact holes can be formed there and hence a structure shown in FIG. 8B can be employed.

In the structure shown in FIG. 8B, each of impurity regions 804 and 805 is completely divided by a plurality of second regions 806 into parts that respectively serve as source regions or drain regions.

Contact holes 807 and 808 are formed in the respective divisional regions of the impurity regions 804 and 805, to realize a configuration in which substantially a plurality of TFTs are connected together in series.

This configuration provides an advantage that a high degree of heat dissipation effect is obtained, because the heat sink function of the second regions 806 can be utilized effectively.

Embodiment 7

Various semiconductor circuits can be constructed by forming circuits using TFTs that are configured according to any of the first to sixth embodiments of the invention. Electro-optical devices as typified by an active matrix LCD can be manufactured by forming such circuits on the same substrate in an integral manner.

It is effective to utilize the invention in other electro-optical devices such as an EL display device and an image sensor in which TFTs are used as switching elements.

It is also effective to utilize TFTs that are configured according to the invention in cases of manufacturing such semiconductor circuits as high-frequency circuits and processor circuits by using TFTs having high operation speed.

By using TFTs that are configured according to the invention in manufacturing those electro-optical devices and semiconductor circuits (each of which is covered by the term "semiconductor device"), the degrees of heat deteriorations are lowered in the entire circuit and hence highly reliable (durable) semiconductor devices can be realized.

Embodiment 8

The electro-optical devices and the semiconductor circuits described in the seventh embodiment can be incorporated in various electronic apparatuses.

A liquid crystal display device and an EL display device can be used as a display device of personal computers, portable terminal apparatuses (mobile computers, cellular telephones, etc.), projection display apparatuses, digital (video) cameras, and the like.

An image sensor can be used as an imaging component of scanners, digital (video) cameras, and the like.

Semiconductor circuits such as a high-frequency circuit and a processor circuit can be used in personal computers and electronic apparatuses having computer-implemented control functions such as consumer electronics products.

As exemplified above, the invention can be utilized in every electronic apparatus that incorporates a semiconductor device that is formed by using TFTs that uses a thin-film semiconductor.

As described above, by utilizing the invention, an effective countermeasure can be taken against Joule heat generation that is associated with operation of a TFT and hence heat deterioration of the TFT due to accumulation heat can be prevented. As a result, a highly reliable circuit that is resistant to self-heating and a highly reliable electronic apparatus incorporating such a circuit can be realized.

What is claimed is:

1. A semiconductor device including a semiconductor circuit having a plurality of thin film transistors, each of the plurality of thin film transistors comprising:

an active layer;

a pair of impurity regions having an n-type or p-type conductivity in the active layer;

an intrinsic region interposed between the pair of impurity regions, said intrinsic region including:

a first region, at least a second region projecting from the first region;

a gate electrode adjacent to said active layer with a gate insulating film therebetween, wherein only the first region is overlapped with a gate electrode.

2. A device according to claim 1, wherein the first region is formed in a self-aligned manner by using the gate electrode as a mask and the second regions is formed intentionally by photolithography.

3. A semiconductor device including a semiconductor circuit having a plurality of thin film transistors, each of the plurality of thin film transistors comprising:

an active layer;

a pair of impurity regions having an n-type or p-type conductivity in the active layer;

an intrinsic region interposed between the pair of impurity regions, said intrinsic region having a double-sided comb shape including:

a trunk portion being perpendicularly to a channel direction, at least a branch portion being parallel with the channel direction;

a gate electrode adjacent to said active layer with a gate insulating film therebetween, wherein only said trunk portion is overlapped with a gate electrode.

4. A device according to claim 1, wherein said active layer comprises silicon or a compound semiconductor including silicon.

5. A semiconductor device comprising:

a semiconductor island formed on an insulating surface;

an intrinsic region having a double-sided comb shape formed in the semiconductor island;

a trunk portion formed in the intrinsic region;

a plurality of branch portions formed in the intrinsic region extending vertically from the trunk portion;

a pair of impurity regions formed in the semiconductor island where the intrinsic region is not formed;

a gate electrode adjacent to only the trunk portion of the intrinsic region with a gate insulating film therebetween, wherein a plurality of channel regions are formed in first regions of the intrinsic region where the plurality of branch portions do not extend from the trunk portion, wherein a plurality of heat sink regions are formed in second portions of the intrinsic region including the plurality of branch portions and a plurality of cross regions of the trunk portion where the plurality of branch portions extend therefrom.

6. A device according to claim 5, wherein the gate electrode is formed over the trunk portion in the intrinsic portion with the gate insulating film therebetween.

7. A device according to claim 6, wherein said semiconductor device is a top-gate type thin film transistor.

8. A device according to claim 6, wherein the gate electrode is formed under the trunk portion in the intrinsic portion with the gate insulating film therebetween.

9. A device according to claim 6, wherein said semiconductor device is a bottom-gate type thin film transistor.

10. A device according to claim 6, wherein said semiconductor device is a liquid crystal display device.

11. A device according to claim 6, wherein said semiconductor device is an EL display device.

12. A device according to claim 6, wherein said semiconductor device is an image sensor.

13. A device according to claim 6, wherein said semiconductor device is a personal computer.

14. A device according to claim 6, wherein said semiconductor device is a portable terminal apparatus.

15. A device according to claim 6, wherein said semiconductor device is a mobile computer.

16. A device according to claim 6, wherein said semiconductor device is a cellular telephone.

17. A device according to claim 6, wherein said semiconductor device is a projection display apparatus.

18. A device according to claim 6, wherein said semiconductor device is a digital (video) camera.

19. A device according to claim 6, wherein said semiconductor device is a scanner.

* * * * *